(12) United States Patent
Chen et al.

(10) Patent No.: US 11,670,575 B2
(45) Date of Patent: Jun. 6, 2023

(54) PACKAGE STRUCTURE, RDL STRUCTURE COMPRISING REDISTRIBUTION LAYER HAVING GROUND PLATES AND SIGNAL LINES

(71) Applicant: Taiwan Semiconductor Manufacturing Company, Ltd., Hsinchu (TW)

(72) Inventors: Chien-Hsun Chen, Pingtung County (TW); Jiun-Yi Wu, Taoyuan (TW); Shou-Yi Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/395,450

(22) Filed: Aug. 5, 2021

(65) Prior Publication Data
US 2021/0366815 A1 Nov. 25, 2021

Related U.S. Application Data

(63) Continuation of application No. 16/441,020, filed on Jun. 14, 2019, now Pat. No. 11,088,059.

(51) Int. Cl.
*H01L 23/495* (2006.01)
*H01L 23/498* (2006.01)
(Continued)

(52) U.S. Cl.
CPC ...... *H01L 23/49822* (2013.01); *H01L 21/486* (2013.01); *H01L 21/4853* (2013.01); *H01L 21/4857* (2013.01); *H01L 21/56* (2013.01); *H01L 21/6835* (2013.01); *H01L 23/145* (2013.01); *H01L 23/3128* (2013.01); *H01L 23/49816* (2013.01); *H01L 23/49833* (2013.01); *H01L 23/49838* (2013.01); *H01L 23/5385* (2013.01); *H01L 23/5386* (2013.01); *H01L 24/16* (2013.01); *H01L 24/32* (2013.01); *H01L 24/73* (2013.01); *H01L 24/81* (2013.01);
(Continued)

(58) Field of Classification Search
None
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Hung K Vu
(74) *Attorney, Agent, or Firm* — JCIPRNET

(57) ABSTRACT

A package structure, and a RDL structure are provided. The package structure incudes a die and a RDL structure electrically connected to the die. The RDL structure includes a first redistribution layer, a second redistribution layer and a third redistribution layer. The first redistribution layer includes a first ground plate. The second redistribution layer includes a second ground plate and a signal trace. The signal trace is laterally spaced from the second ground plate. The third redistribution layer includes a third ground plate. The third redistribution layer and the first redistribution layer are disposed on opposite sides of the second redistribution layer. The signal trace is staggered with at least one of the first ground plate and the third ground plate in a direction perpendicular to a top surface of the signal trace.

20 Claims, 16 Drawing Sheets

(51) Int. Cl.
  *H01L 23/31*   (2006.01)
  *H01L 21/48*   (2006.01)
  *H01L 21/56*   (2006.01)
  *H01L 21/683*  (2006.01)
  *H01L 23/00*   (2006.01)
  *H01L 23/14*   (2006.01)
  *H01L 23/538*  (2006.01)
  *H01L 25/065*  (2023.01)

(52) U.S. Cl.
  CPC ............ *H01L 24/83* (2013.01); *H01L 24/92* (2013.01); *H01L 25/0652* (2013.01); H01L 2221/68345 (2013.01); H01L 2221/68359 (2013.01); H01L 2221/68372 (2013.01); H01L 2224/16238 (2013.01); H01L 2224/32225 (2013.01); H01L 2224/73204 (2013.01); H01L 2224/81192 (2013.01); H01L 2224/92125 (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2003/0051910 A1* | 3/2003 | Dyke ................ H01L 23/49838 257/E23.079 |
| 2017/0005054 A1* | 1/2017 | Chiu ...................... H01L 24/08 |

* cited by examiner

PACKAGE STRUCTURE, RDL STRUCTURE COMPRISING REDISTRIBUTION LAYER HAVING GROUND PLATES AND SIGNAL LINES

CROSS-REFERENCE TO RELATED APPLICATION

This application is a continuation application of and claims the priority benefit of a prior application Ser. No. 16/441,020, filed on Jun. 14, 2019, now allowed. The entirety of the above-mentioned patent application is hereby incorporated by reference herein and made a part of this specification.

BACKGROUND

Semiconductor packages are used in a variety of electronic applications, such as personal computers, cell phones, digital cameras, and other electronic equipment. In terms of the packaging used for integrated circuit components or semiconductor dies, one or more dies or packages are generally bonded to a circuit carrier (e.g., a system board, a printed circuit board, or the like) for electrical connections to other external devices or electronic components. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
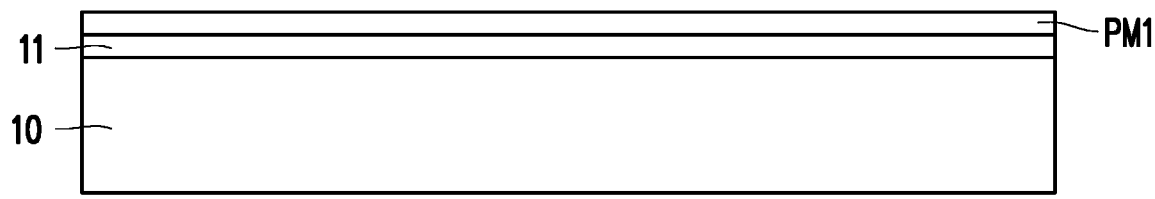
FIG. 1A to FIG. 1G are cross-sectional view illustrating a method of forming a package structure according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross-sectional views illustrating a method of forming a package structure according to a first embodiment of the disclosure.

Referring to FIG. 1A, a carrier 10 is provided. The carrier 10 may be a glass carrier, a ceramic carrier, or the like. A de-bonding layer 11 is formed on the carrier 10 by, for example, a spin coating method. In some embodiments, the de-bonding layer 11 may include a Ultra-Violet (UV) glue, a Light-to-Heat Conversion (LTHC) material, an epoxy-based thermal-release material, or the like. The de-bonding layer 11 is decomposable under the heat of light to thereby release the carrier 10 from the overlying structures that will be formed in subsequent processes.

A polymer layer PM1 is formed over the carrier 10. The polymer layer PM1 includes polybenzoxazole (PBO), polyimide (PI), benzocyclobutene (BCB), combinations thereof or the like, but the disclosure is not limited thereto. In some other embodiments, the polymer layer PM1 may be replaced by or include inorganic dielectric material. The inorganic dielectric material may include a nitride such as silicon nitride, an oxide such as silicon oxide, an oxynitride such as silicon oxynitride, phosphosilicate glass (PSG), borosilicate glass (BSG), boron-doped phosphosilicate glass (BPSG), or the like, or combinations thereof. The forming methods of the polymer layer PM1 include suitable fabrication techniques such as spin coating, chemical vapor deposition (CVD), plasma-enhanced chemical vapor deposition (PECVD), lamination or the like.

In some embodiments, the polymer layer PM1 has a low dissipation factor (DO and a low dielectric constant (Dk, k-value). For example, the k-value of the polymer layer PM1 may be less than 3. In some embodiments, the polymer layer PM1 may include additional materials (such as fillers) added in the polymer material (such as PI) to adjust the Df and the Dk of the polymer layer, such that the polymer layer PM1 has the desirable low Df and Dk. The fillers may include dielectric material having a Df and Dk lower than the polymer material. However, the disclosure is not limited thereto.

Figure 1B:
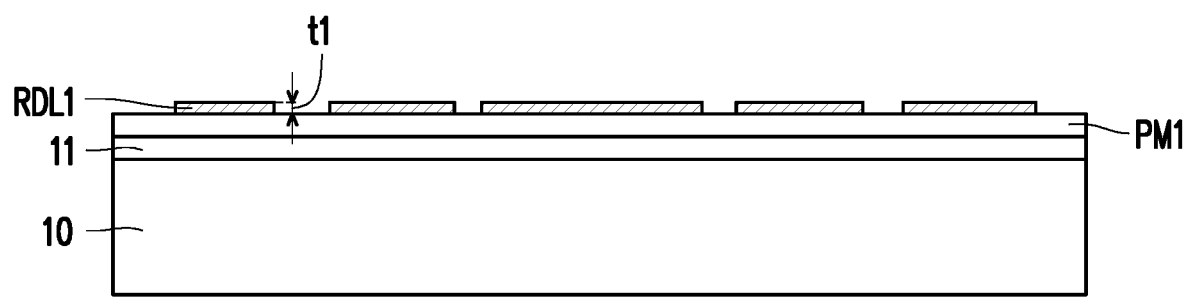

Referring to FIG. 1B, a redistribution layer RDL1 is formed on the polymer layer PM1. The redistribution layer RDL1 includes conductive materials. The conductive material includes metal such as copper, nickel, titanium, a combination thereof or the like. In some embodiments, the redistribution layer RDL1 includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. However, the disclosure is not limited thereto. In some embodiments, the thickness t1 of the redistribution layer RDL1 is, for example, 5 μm.

In some embodiments, the redistribution layer RDL1 may be formed by the following processes: a seed material layer is formed on the polymer layer PM1 by a physical vapor deposition (PVD) process such as sputtering, thereafter, a patterned mask layer such as a patterned photoresist is formed on the seed material layer, the patterned mask layer has openings exposing portions of the seed material layer. Thereafter, the metal layer is formed on the seed material layer exposed by the openings through electroplating, for example. The patterned mask layer is then stripped and the seed material layer not covered by the metal layer is removed. As such, the metal layer and the remained seed layer underlying the metal layer constitute the redistribution layer RDL1. In some embodiments, the redistribution layer RDL1 includes one or more ground plates and signal lines.

Figure 1C:
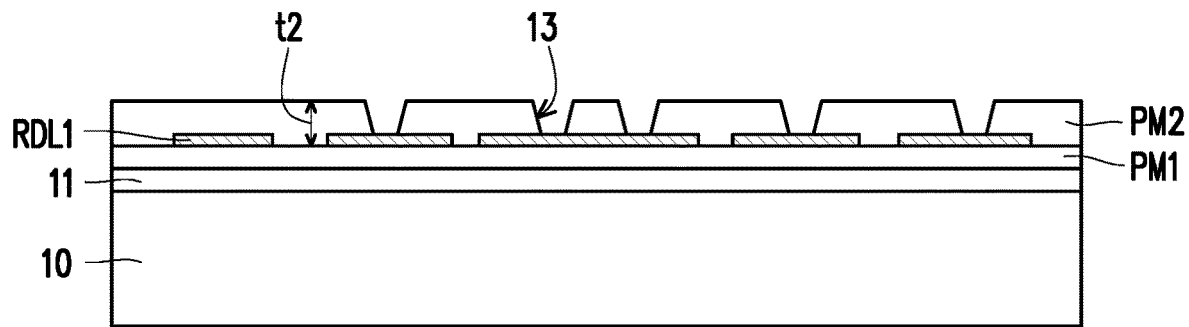

Referring to FIG. 1C, a polymer layer PM2 is formed on the polymer layer PM1 and the redistribution layer RDL1, the material and forming method of the polymer layer PM2 are similar to, and may be the same as or different from those of the polymer layer PM1. The polymer layer PM2 is patterned to form a plurality of openings 13 exposing portions of the top surface of the redistribution layer RDL1. The opening 13 may be a via hole or a via trench. The patterning method of the polymer layer PM2 may include a laser drilling process or photolithography and etching processes. In some embodiments, the thickness t2 of the polymer layer PM2 is, for example, 15 μm. The thickness of the polymer layer PM2 may be the same as or different from the thickness of the polymer layer PM1. In some embodiments, the polymer layer PM2 may be thicker than the polymer layer PM1, but the disclosure is not limited thereto.

Figure 1D:
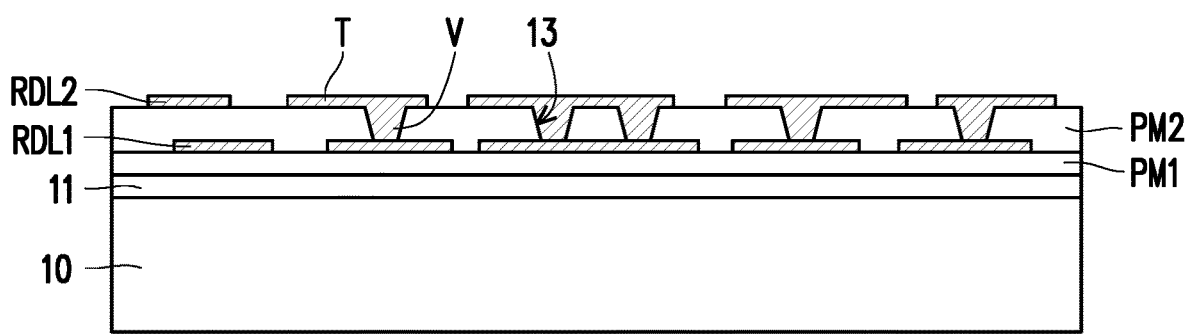

Referring to FIG. 1D, a redistribution layer RDL2 is formed on the polymer layer PM2 and filled in the openings 13 to electrically connect to the redistribution layer RDL1. In other words, the redistribution layer RDL2 penetrates through the polymer layer PM2 to connect to the redistribution layer RDL1. The material and forming method of the redistribution layer RDL2 are similar to, and may be the same as or different from those of the redistribution layer RDL1, which are not described again here. In some embodiments, the redistribution layer RDL2 includes one or more ground plates and signal lines.

The redistribution layer RDL2 includes a plurality of vias V and conductive layers T connected to each other, the via V is filled in the opening 13 of polymer layer PM2, penetrating through the polymer layer PM2 to be in contact with the redistribution layer RDL1. The cross-sectional view of the via V may be square, rectangle, trapezoid, or the like. In some embodiments, the via V is tapered toward the redistribution layer RDL1. However, the disclosure is not limited thereto. The conductive layer T is connected to the via V and extending on the top surface of the polymer layer PM2. The conductive layer T is electrically connected to the redistribution layer RDL1 through the via V. The conductive layers T may include portions of the ground plates and signal lines. The vias V may include ground vias for connecting the ground plate of the redistribution layers RDL1 to the ground plate of the redistribution layer RDL2, and signal vias for connecting the signal lines of the redistribution layer RDL1 to the signal lines of the redistribution layer RDL2.

Figure 1E:
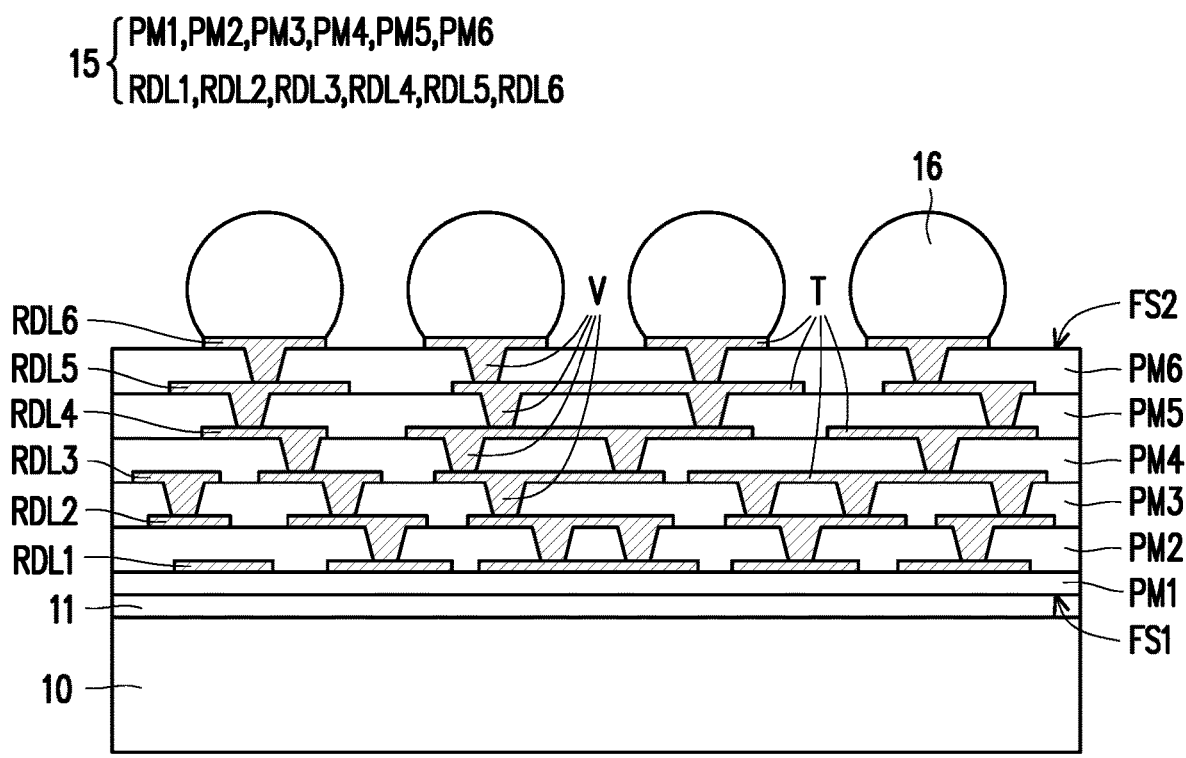

Referring to FIG. 1E, processes similar to those described in FIG. 1C and FIG. 1D are repeated to stack multiple polymer layers and redistribution layers over the carrier 10, so as to form a redistribution layer (RDL) structure 15. In some embodiments, the RDL structure 15 includes the polymer layers PM1, PM2, PM3, PM4, PM5, PM6 and the redistribution layers RDL1, RLD2, RDL3, RDL4, RDL5, RDL6 stacked alternately. The number of the polymer layers and the redistribution layers illustrated in FIG. 1E is merely for illustration, and the disclosure is not limited thereto. The thicknesses of the polymer layers may be the same as or different from each other, and may be in a range similar to those described with respect to the polymer layer PM1, respectively. The thicknesses of the redistribution layers may be the same as or different form each other, and may be in a range similar to those described with respect to the redistribution layer RDL1, respectively.

The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. The redistribution layer RDL5 penetrates through the polymer layer PM5 and is electrically connected to the redistribution layer RDL4. The redistribution layer RDL6 penetrates through the polymer layer PM6 and is electrically connected to the redistribution layer RDL5.

Similar to the redistribution layer RDL2, the redistribution layers RDL3, RDL4, RDL5, and RDL 6 also include a plurality of vias V and conductive layers T, respectively. The vias V penetrates through the polymer layers to connect the conductive layers T of the redistribution layers, and the conductive layers T are located on and extending along the top surfaces of the polymer layers, respectively. In some embodiments, the top surface of the via V is substantially coplanar with the corresponding conductive layer T.

Still referring to FIG. 1E, in some embodiments, the redistribution layer RDL6 is the topmost redistribution layer of the RDL structure 15 and may be or include a under-ball metallurgy (UBM) layer for ball mounting. A plurality of connectors 16 are formed on and electrically connected to the redistribution layer RDL6. The connectors 16 may be solder regions such as solder balls or ball grid array (BGA) connectors. In some embodiments, the connectors 16 may also be referred to as conductive terminals. The connectors 16 are located on the second side FS2 of the RDL structure 15, while the carrier 10 is located on the first side FS1 of the RDL structure 15.

Figure 1F:
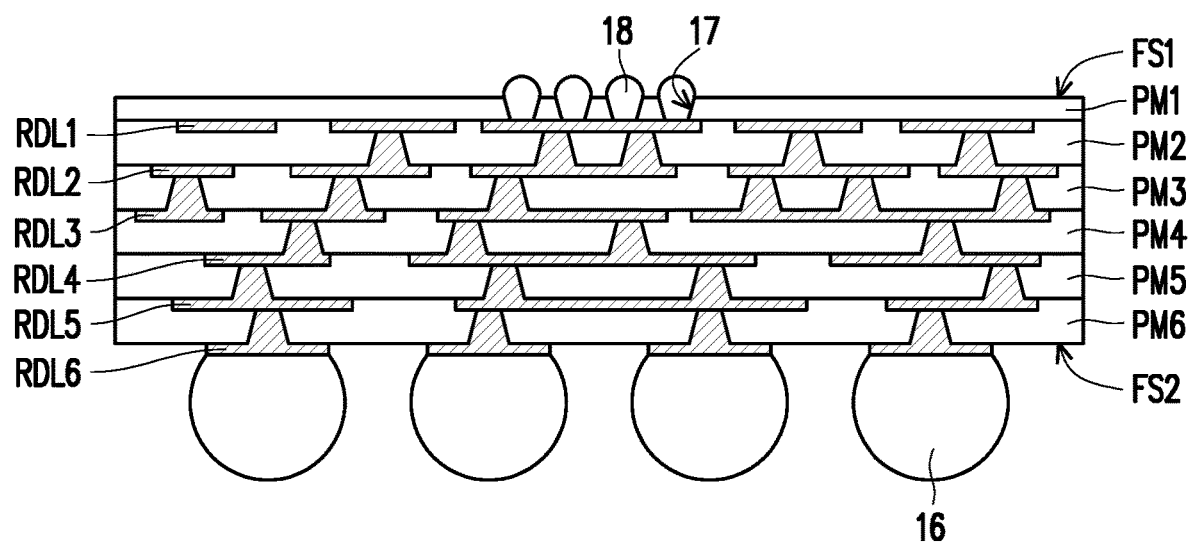

Referring to FIG. 1E and FIG. 1F, in some embodiments, the de-bonding layer 11 is decomposed under the heat of light, and the carrier 10 is then released from the RDL structure 15. The RDL structure 15 with the connectors 16 is then turned over, such that the polymer layer PM1 (that is, the first side FS1) is upward.

Referring to FIG. 1F, the polymer layer PM1 is patterned to form a plurality of openings 17 by laser drilling process, for example. The openings 17 expose portions of the redistribution layer RDL1. The cross-sectional view of the opening 17 may be square, rectangle, trapezoid, or the like, or any other suitable shape. In some embodiments, the opening 17 is tapered toward the redistribution layer RDL1. Thereafter, connectors 18 are formed on the redistribution layer RDL1 exposed by the openings 17 of the polymer layer PM1. The connectors 18 may include solder bumps, solder balls, copper bumps, or any other suitable metallic bumps or balls, or combinations thereof. In some embodiments in which the connectors 18 are solder regions, a UBM layer (not shown) may further be formed between the respective connector 18 and the redistribution layer RDL1. The connectors 18 are electrically connected to the RDL structure 15 and further electrically connected to the connectors 16 through the RDL structure 15. In some embodiments, the dimension of the connector 18 is less than the dimension of the connector 16. However, the disclosure is not limited thereto.

Figure 1G:
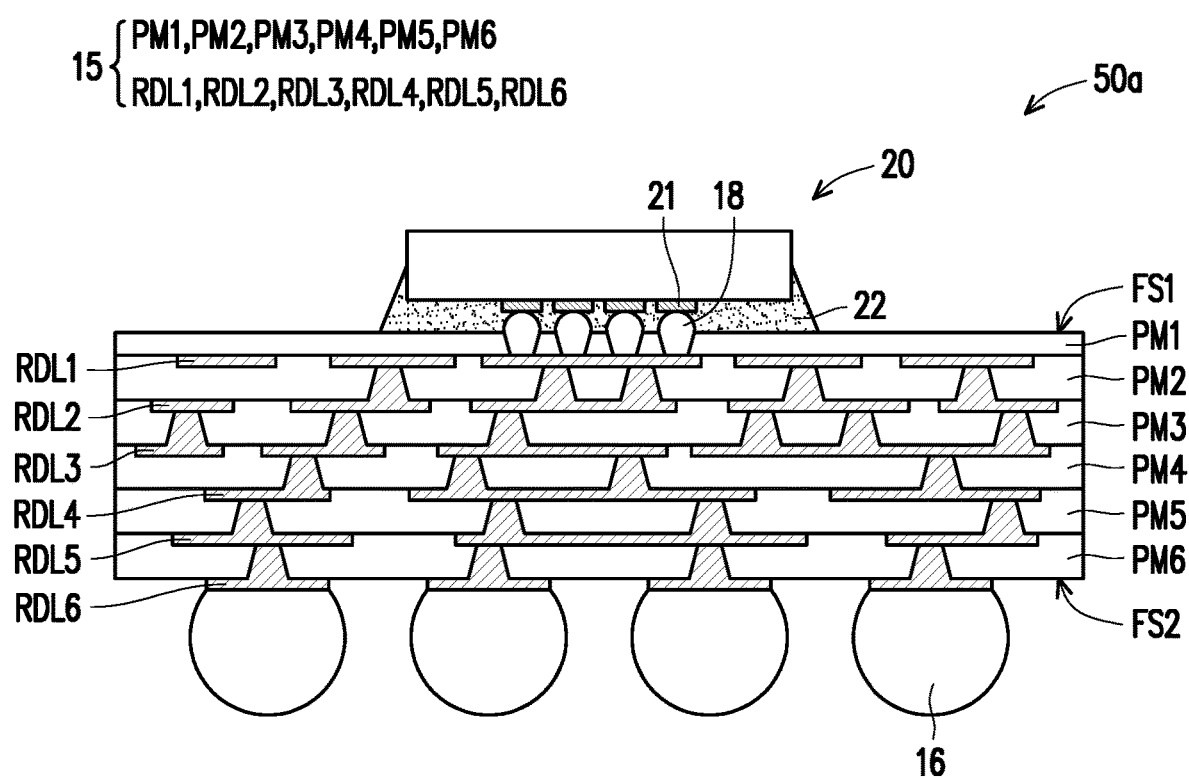

Referring to FIG. 1G, a die structure 20 is electrically coupled to the RDL structure 15 through the connectors 18. The die structure 20 includes a plurality of connectors 21 electrically bonded to the connectors 18. The connectors 21 may include materials selected from the same candidate material of the connectors 18, and the material of the connector 21 may be the same as or different form the material of the connector 18. The die structure 20 may be or include one or more dies or one or more semiconductor packages including die(s), interposer or combinations thereof, the semiconductor packages may include System-On-Chip (SoC) packages, Chip-On-Wafer (CoW) packages, Integrated-Fan-Out (InFO) packages, Chip-On-Wafer-On-Substrate (CoWoS) packages, three-dimensional integrated circuit (3DIC) packages, Package-on-Package (PoP) systems, and/or the like, or combinations thereof. An example of the die structure 20 will be described in detail with reference to FIGS. 5 and 6.

An underfill layer 22 is formed to fill the space between the die structure 20 and the RDL structure 15. In some embodiments, the underfill layer 22 covers a portion of the surface of the polymer layer PM1, the bottom surface of the die structure 20, and/or a portion of sidewalls of the die structure 20, and laterally surrounds the connectors 18 and 21.

Still referring to FIG. 1G, a package structure 50a is thus formed, the package structure 50a includes the die structure 20, the RDL structure 15 and the connectors 16. The die structure 20 is connected to the RDL structure 15 through the connectors 18. In some embodiments, the RDL structure 15 may be referred to as a substrate like InFO (integrated fan-out) RDL structure. The RDL structure 15 has the first side FS1 and the second side FS2 opposite to each other. The die structure 20 is disposed on the first side FS1 of the RDL structure 15, and the connectors 16 are disposed on the second side FS2 of the RDL structure 15.

Figure 2A:
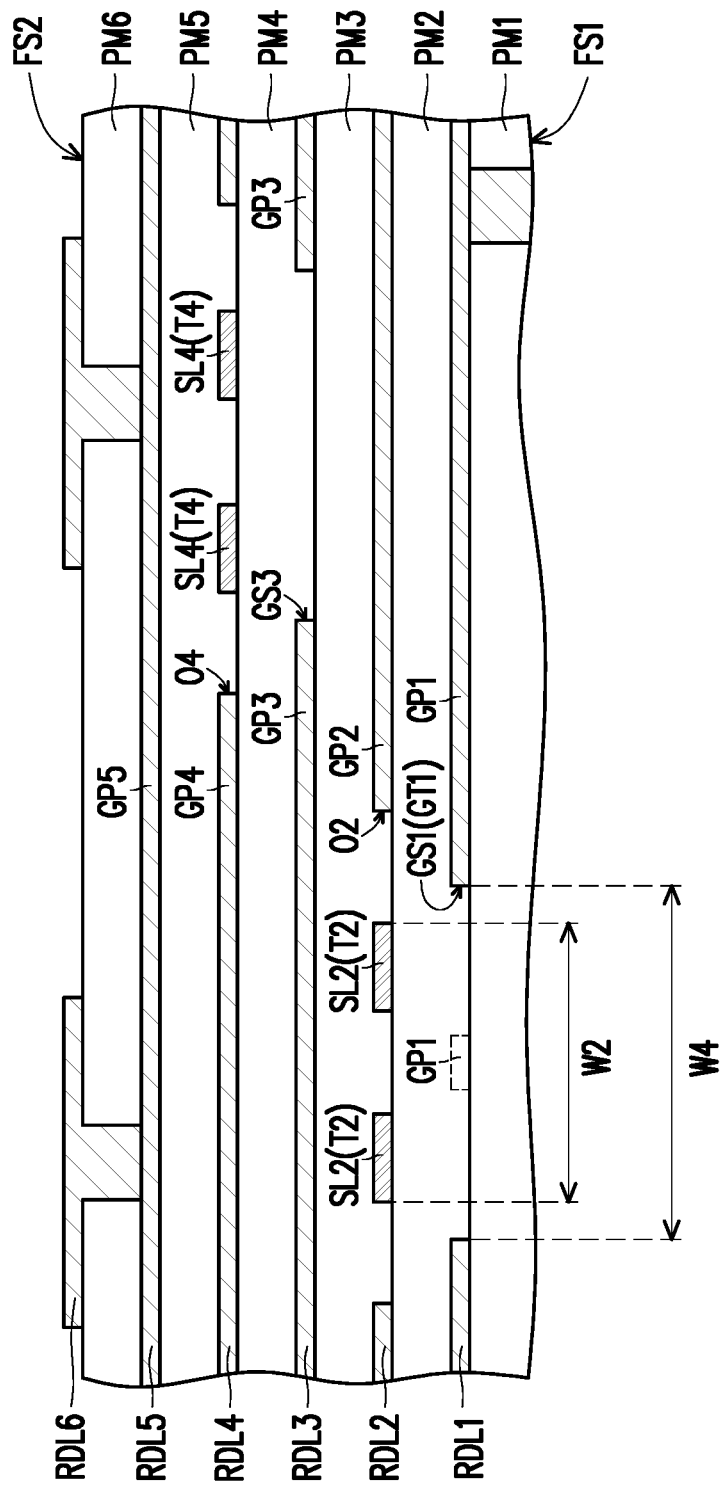
FIG. 2A are enlarged cross-sectional view of a portion of a RDL structure according to some embodiments of the disclosure, FIG. 2B to FIG. 2D illustrates some examples of a top view of a portion of a RDL structure according to some embodiments of the disclosure.
Figure 2B:
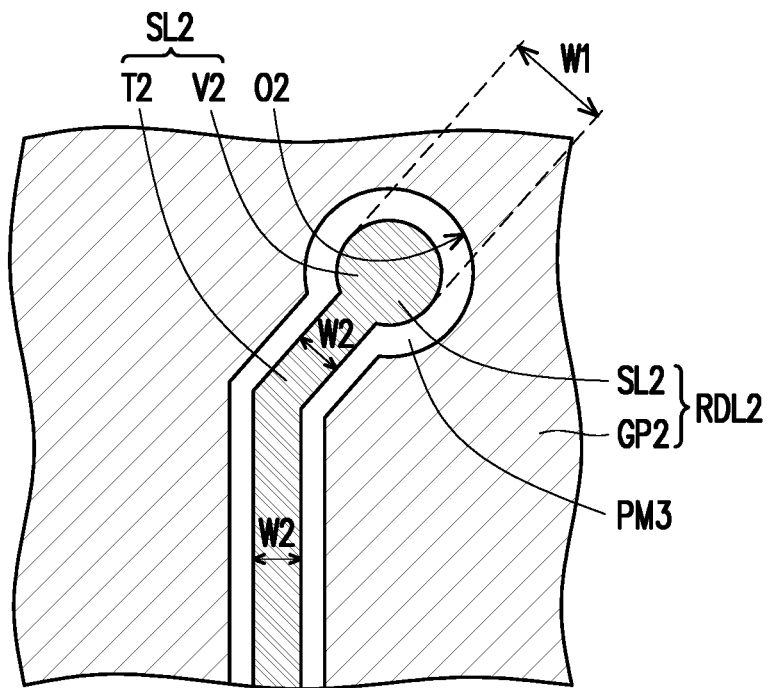
Figure 2C:
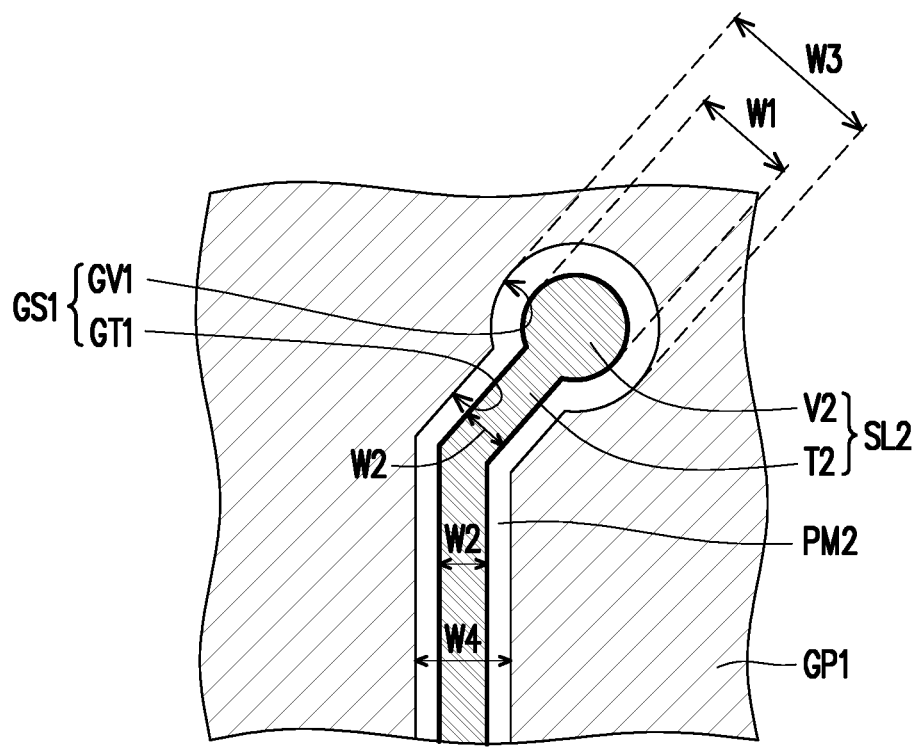
Figure 2D:
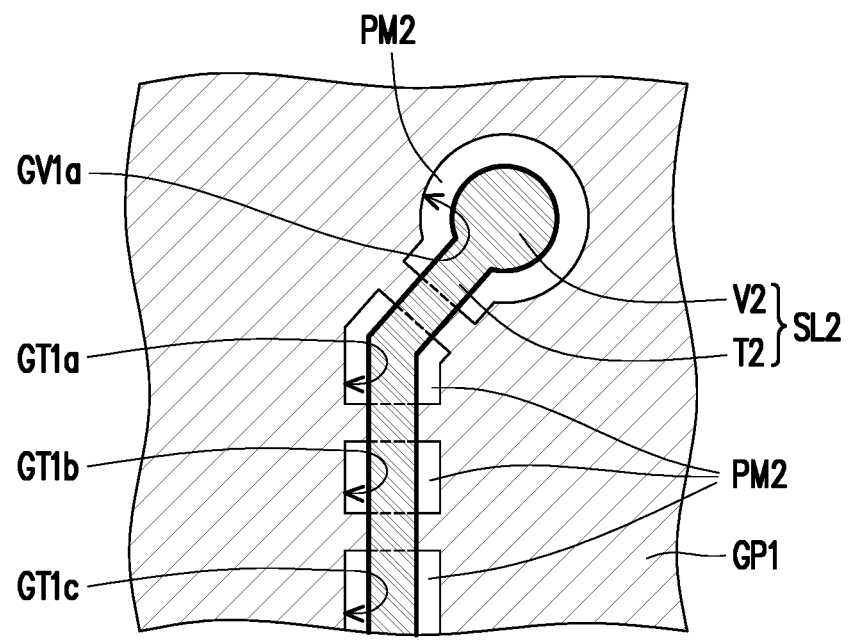
Figure 3A:
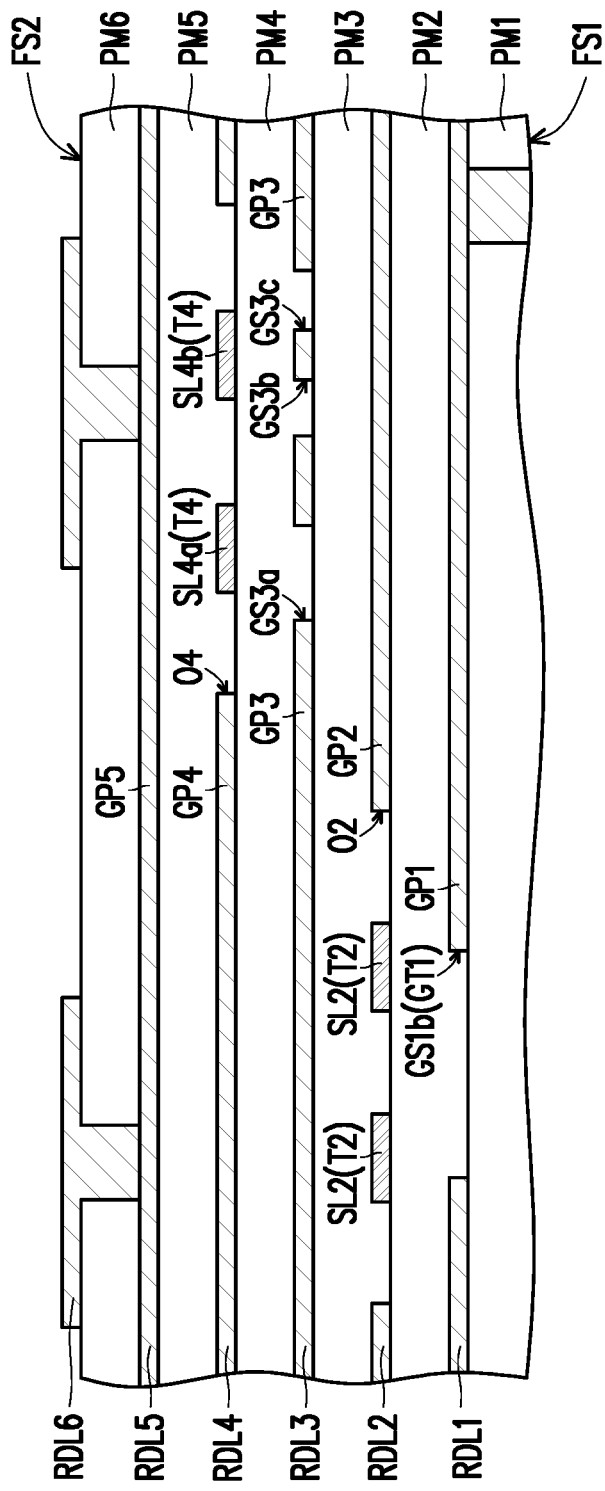
FIG. 3A are enlarged cross-sectional view of a portion of a RDL structure according to some other embodiments of the disclosure, FIG. 3B to FIG. 3C illustrates some examples of a top view of a portion of a RDL structure according to some other embodiments of the disclosure.

FIG. 2A and FIG. 3A respectively illustrates an enlarged cross-sectional view of a portion of the RDL structure 15 with the second side FS2 thereof upward according to some embodiments of the disclosure. FIG. 2B illustrates a top view of a portion of the redistribution layers RDL2 according to some embodiments of the disclosure. FIGS. 2C and 2D, and FIGS. 3B and 3C respectively illustrates a top view of a portion of the redistribution layers RDL2 and RDL1 according to some embodiments of the disclosure, respectively.

Referring to FIG. 2A, in some embodiments, the redistribution layers RDL1, RDL2, RDL3, RDL4, RDL5 include one or more ground plates and signal lines. The ground plates are grounded and may be connected to ground pads of the die included in the die structure 20 (FIG. 1G), and the signal lines are used for transmitting signal and may be connected to signal pads of the die included in the die structure 20. For example, the redistribution layer RDL1 includes a ground plate GP1 and signal lines, the redistribution layer RDL2 includes a ground plate GP2 and signal lines SL2, the redistribution layer RDL3 includes a ground plate GP3 and signal lines, the redistribution layer RDL4 include a ground plate GP4 and signal lines SL4, the redistribution layer RDL5 includes a ground plate GP5 and signal lines. For the sake of brevity, merely signal lines of the redistribution layers RDL2 and RDL4 are shown for illustration, and signal lines of the redistribution layers RDL1, RDL3 and RDL5 are not shown. In some embodiments, the signal lines and the ground plate in a same redistribution layer may be formed via a same patterning process and may be formed simultaneously. However, the disclosure is not limited thereto. The number of the ground plates and signal lines are not limited in the disclosure.

Referring to FIG. 2A and FIG. 2B, in some embodiments, in the respective redistribution layer, the ground plate includes openings for signal lines extending through. For example, the ground plate GP2 of the redistribution layer RDL2 include one or more opening O2 for signal lines SL2 extending through, the ground plate GP4 of the redistribution layer RDL4 includes one or more openings O4 for signal lines SL4 extending through. The details will be discussed taken the redistribution layer RDL2 as an example.

Still referring to FIG. 2A and FIG. 2B, One or more signal lines SL2 are located and extending within the opening O2 of the ground plate GP2. The polymer layer PM3 is filled in the opening O2 and laterally between the ground plate GP2 and the signal line SL2, and/or between the adjacent signal lines SL2. In other words, the ground plate GP2 and the signal lines SL2 are disposed side by side and spaced from each other by the polymer layer PM3 therebetween. In the cross-sectional view FIG. 2A, two signal lines SL2 are illustrated within the opening O2 of the ground plate GP2. For the sake of brevity, one signal line SL2 is illustrated in the opening O2 of the ground plate GP2 in the top view FIG. 2B. However, the disclosure is not limited thereto. More signal lines SL2 may be located within one opening O2 of the ground plate GP2, and the ground plate GP2 may include a plurality of openings O2, the number of the signal lines SL2 within different openings O2 may be the same or different, and are not limited in the disclosure. It is understood that the number of the openings O2 of the ground plate GP2 and the number of the signal lines SL2 located in the respective opening O2 illustrated in the figures are merely for illustration, and the disclosure is not limited thereto.

In some embodiments, the top surfaces of the signal lines SL2 and the ground plate GP2 are substantially coplanar with each other, the bottom surfaces of the signal lines SL2, the ground plate GP2 and the polymer layer PM3 are substantially coplanar with each other. However, the disclosure is not limited thereto.

Still referring to FIG. 2A and FIG. 2B, the signal line SL2 includes a signal via V2 (shown in FIG. 2B and not shown in FIG. 2A) and a signal trace T2 connected to each other.

In some embodiments, the signal via V2 is located at an end of the signal trace T2, penetrating through the polymer layer PM2 to connect to the signal line (not shown) of the redistribution layer RDL1. The top view of the signal via V2 may be circular-shaped, oval-shaped, the like or any other suitable shaped. The signal trace T2 of the signal line SL2 is line-shaped, and extending on the top surface of the polymer layer PM2. The bottom surface of the signal trace T2 is in physical contact with the top surface of the polymer layer PM2. In some embodiments, the top surface of the signal trace T2 and the top surface of the signal via V2 are substantially coplanar with each other, but the disclosure is not limited thereto. In some embodiments, the opening O2 includes a via opening within which the via V2 is disposed and a trace opening within which the trace T2 is extending.

In some embodiments, the width W1 (such as the diameter) of the signal via V2 is larger than the width W2 of the signal trace T2, but the disclosure is not limited thereto. Herein, the width of the signal trace refers to the distance between opposite sidewalls of the signal trace in a direction perpendicular to the extending direction of the signal trace. In alternative embodiments, the width W1 of the signal via V2 may be equal to or less than the width W2 of the signal trace T2.

Referring to FIG. 2A and FIG. 2C, in some embodiments, the ground plate GP1 of the redistribution layer RDL1 has one or more ground slots GS1 below (such as, directly below) the signal lines SL2 of the redistribution layer RDL2. In some embodiments, the ground slot GS1 is a discontinuity of the ground plate GP1 other than the openings for signal lines extending through. The ground slot GS1 expose a portion of the top surface of the polymer layer PM1, and a portion of the polymer layer PM2 is filled in the ground slot GS1 and in contact with the polymer layer PM1. The bottom surface of the polymer layer PM2 is substantially coplanar with the bottom surface of the ground plate GP1.

In some embodiments, the signal lines SL2 are staggered (such as completely staggered) with the ground plate GP1 of the redistribution layer RDL1, and overlapped with a portion of the polymer layer PM2 in the ground slot GS1 in a direction perpendicular to the bottom surface of the signal line SL2. When viewed in the top view FIG. 2C, the signal line SL2 of the redistribution layer RDL2 is located within the ground slot GS1 of the ground plate GP1. That is to say, the orthogonal projection of the signal line SL2 on the top surface of the polymer layer PM1 or the bottom surface of the polymer layer PM2 is located within the ground slot GS1 of the ground plate GP1, and is overlapped with a portion of the polymer layer PM2 within the ground slot GS1. However, the disclosure is not limited thereto.

As shown in the cross-sectional view FIG. 2A, more than one (such as two) signal lines SL2 corresponds to one ground slot GS1, but the disclosure is not limited thereto. As illustrated in the dotted line of FIG. 2A and as shown in FIG. 2C, one signal line SL2 corresponding to one ground slot GS1. In some other embodiments, one signal line SL2 may corresponds to more than one ground slot GS1. It is noted that, the numbers of the signal lines and the corresponding ground slot are not limited in the disclosure. Depending on the product requirement and design, the number of the signal lines SL2 may be less than, equal to or larger than the number of the corresponding ground slots GS1 of the ground plate GP1.

Referring to FIG. 2C, in some embodiments, the ground slot GS1 include a via slot GV1 and a trace slot GT1 in spatial communication with each other. The via slot GV1 is directly below the signal via V2 of the signal line SL2, and the trace slot GT1 is directly below the signal trace T2 of the signal line SL2. That is, the orthogonal projection of the signal via V2 on the top surface of the polymer layer PM1 is within the via slot GV1, and the orthogonal projection of the signal trace T2 on the top surface of the polymer layer PM1 is within the trace slot GT1.

In some embodiments, the redistribution layer RDL1 is free of signal line within the trace slot GT1 of the ground slot GS1. In some embodiments, there is free of metal or conductive feature between the signal trace T2 of signal line SL2 and the top surface of the polymer layer PM1 directly below the signal trace T2 of the signal line SL2. In some embodiments, the redistribution layer RDL1 is free of signal line within the via slot GV1 of the ground slot GS1. However, the disclosure is not limited thereto. In alternative embodiments, a portion of the signal line (not shown) of the redistribution layer RDL1 is located within the via slot GV1 of the ground plate GP1, to connect to the signal via V2 of the signal line SL2.

Still referring to FIG. 2C, in some embodiments, the ground slot GS1 has an outer profile or shape similar to that of the signal line SL2, but the disclosure is not limited thereto. The ground slot GS1 may have any suitable outer profile or shape, as long as the orthogonal projection of the signal via V2 and the signal trace T2 of the signal line SL2 on the top surface of the polymer layer PM1 is within the ground slot GS1 of the ground plate GP1. In some embodiments, the trace slot GT1 extends in a direction substantially the same as the extending direction of the signal trace T2. However, the disclosure is not limited thereto.

In some embodiments, the width W3 of the via slot GV1 is larger than the width W1 of the signal via(s) V2, the width W4 of the trace slot GT1 is larger than the width W2 of the signal trace(s) T2, but the disclosure is not limited thereto. In alternative embodiments, the width W4 of the trace slot GT1 may be equal to or less than the width W2 of the signal trace T2. Herein, the width of the trace slot refers to the distance between opposite sidewalls of the trace slot in a direction perpendicular to the extending direction of the trace slot GT1 (i.e. the extending direction of the signal trace T2). In some embodiments in which more than one signal traces T2 corresponds to one ground slot GS1, the width W2 of the signal traces T2 refers to the width between the opposite outer sidewalls of the signal traces T2, as shown in FIG. 2A. In some embodiments, the sidewalls of the ground slot GS1 may be aligned with or laterally shift from the sidewalls of the signal lines SL2.

In the embodiments illustrated in FIG. 2C, the ground slot is a continuous trench, but the disclosure is not limited thereto. FIG. 2D illustrate an example in which the signal trace of the signal line SL2 is partially overlapped with the ground plate GP1 in the direction perpendicular to the bottom surface of the signal line SL2, wherein the ground plate GP1 has a ground slot GS1a which is discontinuous.

Referring to FIG. 2A and FIG. 2D, in some embodiments, the ground slot GS1a includes a plurality of discrete openings distributed below (such as directly below) the extending path of the signal line SL2 of the redistribution layer RDL2. The openings may be holes, trenches or combinations thereof. For examples, the ground slot GS1a may include a via slot GV1a and a plurality of trace slots GT1a, GT1b, GT1c spaced from each other. In some embodiments, the via slot GV1a may be in spatial communication with a portion of the trace slot, but the disclosure is not limited thereto. The via slot GV1a is directly below the signal via V2 of the signal line SL2, and the trace slots GT1a, GT1b, GT1c are directly below the signal trace T2 of the signal line SL2.

Portions of the polymer layer PM2 are located within the via slots GV1a and the trace slots GT1a, GT1b, GT1c, and are laterally spaced from each other by the ground plate GP1 therebetween. Portions of the ground plate GP1 between the openings (i.e. slots) GV1a, GT1a, GT1b, GT1c are directly below the signal line SL2 and is overlapped with a portion of the signal line SL2 in a direction perpendicular to the top surface of the polymer layer PM1 or the bottom surface of the signal line SL2.

In some embodiments, the trace slots GT1a, GT1b, GT1c are arranged in a direction the same as the extending direction of the signal trace T2 of the signal line SL2. The number of the openings, that is, the number of the via slot and the trace slots included in the ground slot GS1a shown in FIG. 2D are merely for illustration, and the disclosure is not limited thereto. In some embodiments, the width (such as diameter) of the via slot GV1a is larger than the width (such as the bottom diameter) of the signal via V2 of the signal line SL2, the width of the trace slot GT1a, GT1b, GT1c may be larger than, equal to or less than the corresponding signal trace portion of the signal line SL2, respectively. The sizes of the openings in one ground slot may be the same or different. In some embodiments, different ground slots for different signal lines may have via and trace slots of different number, shape or size, etc. The sizes or numbers of the ground slots may be adjusted according to product design, which are not limited in the disclosure, as long as the overlapping area between the ground plate GP1 and the signal trace T2 of the signal line SL2 in the direction perpendicular to the bottom surface of the signal trace T2 is less than the area of the bottom surface of the signal trace T2 of the corresponding signal line SL2.

Referring to FIG. 2A, in some embodiments, the ground plate GP3 of the redistribution layer RDL3 is free of ground slot at the position directly over the signal line SL2 of the redistribution layer RDL2, but the disclosure is not limited thereto. In some embodiments, the ground plate GP3 of the redistribution layer RDL3 may also include a ground slot directly over the signal line SL2, and the redistribution layer RDL3 is free of signal line or conductive feature within the ground slot of the ground plate GP3. That is, the overlapping area between the signal line SL2 and the ground plate GP3 in the direction perpendicular to the top surface of the signal line SL2 may be less than the area of the top surface of the signal line SL2, and may be zero in some embodiments. The features of the ground slot of the ground plate GP3 are similar to, and may be the same as or different from those of the ground slot GS1 of the ground plate GP1, and the ground slots of the ground plates GP1 and GP3 may be symmetrically or asymmetrically disposed with respect to the signal line SL2.

In some embodiments, the redistribution layer RDL3 includes signal lines located within openings of the ground plate GP3. In some embodiments, a portion of the openings (such as via opening) of the ground plate GP3 may be located directly over the signal lines SL2 of the redistribution layer RDL2, such that the signal via (not shown) of the redistribution layer RDL3 penetrates through the ground plate GP3 and the polymer layer PM3 to connect to the signal line SL2. It is noted that, the ground slot of the redistribution layer RDL3 described herein is the discontinuity of the ground plate GP3 other than the openings within which the signal lines are disposed, and there is free of conductive feature in the said ground slot of the redistribution layer RDL3. The ground slot may be in spatial communication with or spaced from the openings.

In the illustrated embodiments, the ground plate GP1 has the ground slot GS1 at the corresponding position below the signal trace T2 of the signal line SL2, while the ground plate GP3 is free of ground slot at the corresponding position over the signal line SL2, but the disclosure is not limited thereto. In alternative embodiments, the ground plate GP1 is free of trace slot at the corresponding position below the signal trace T2 of the signal line SL2 and include a via slot blow the signal via V2 or for the signal via V2 penetrating through, while the ground plate GP3 has a ground slot at the corresponding position over the signal line SL2, the polymer layer PM4 is filled in the ground slot and there is free of conductive feature within the ground slot of the ground plate GP3. In yet another embodiment, both the ground plate GP1 and the ground plate GP3 have ground slots at the position corresponding to the signal trace T2 and signal via V2 of the signal line SL2. In the embodiments of the disclosure, at least one of the following conditions is required: (1) the ground plate GP1 has ground slot directly below the signal trace T2 of the signal line SL2 of the redistribution layer RDL2, (2) the ground plate GP3 has ground slot directly over the signal trace T2 or/and the signal via V2 of the signal line SL2 of the redistribution layer RDL2.

In other words, the orthogonal projection of the signal line SL2 on the top surface of the polymer layer PM1 may be staggered (such as completely staggered) with at least one of the orthogonal projections of the ground plate GP1 and the ground plate GP3 on the top surface of the polymer layer PM1.

Still referring to FIG. 2A, similar to the ground slot GS1 in the ground plate GP1, the ground plate GP3 also include a ground slot GS3 directly below the signal line SL4 of the redistribution layer RDL4. The signal lines SL4 are located within the opening O4 of the ground plate GP4. The features of the signal lines SL4 and the corresponding ground slot GS3 are similar to, and may be the same as or different from those of the signal lines SL2 and ground slot GS1 described above. The ground plate GP3 having the ground slot GS3 is of the redistribution layer RDL3 which is immediately adjacent to and under the redistribution layer RLD4. In some embodiments, the ground plate GP2 of the redistribution layer RDL2 and the ground plate GP1 of the redistribution layer RDL1 are free of ground slot at the position directly below the signal traces T4 of the signal lines SL4. However, the disclosure is not limited thereto. In alternative embodiments, the ground plate GP2 or/and the ground plate GP1 may also have ground slot at the position directly below the signal trace T4 of the signal line SL4, respectively. The relations between the signal lines SL4 and the ground slots of the ground plates GP1 and GP2 may be similar to those described above with respect to the signal lines SL2 and the ground slot GS1.

Figure 3B:
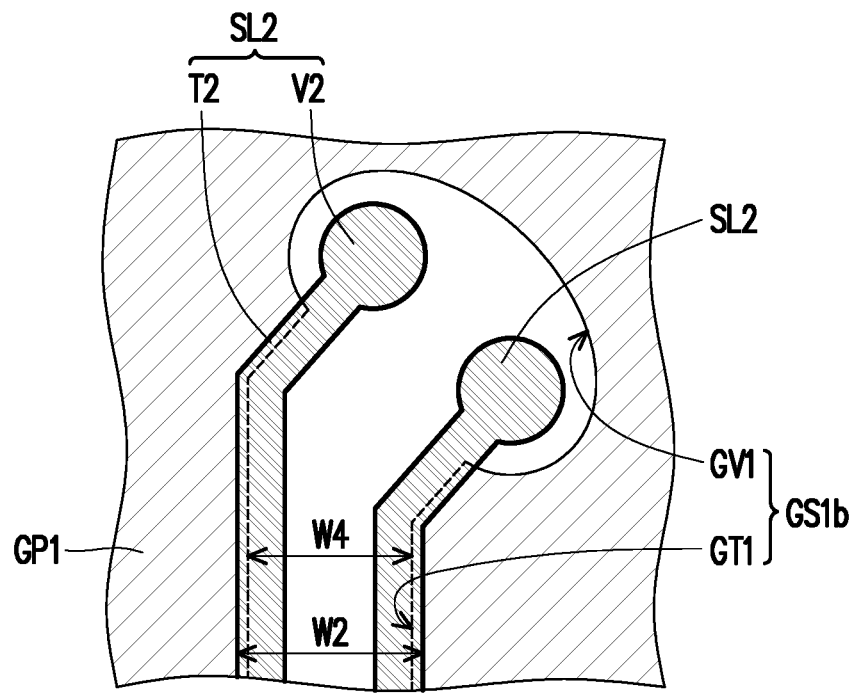
Figure 3C:
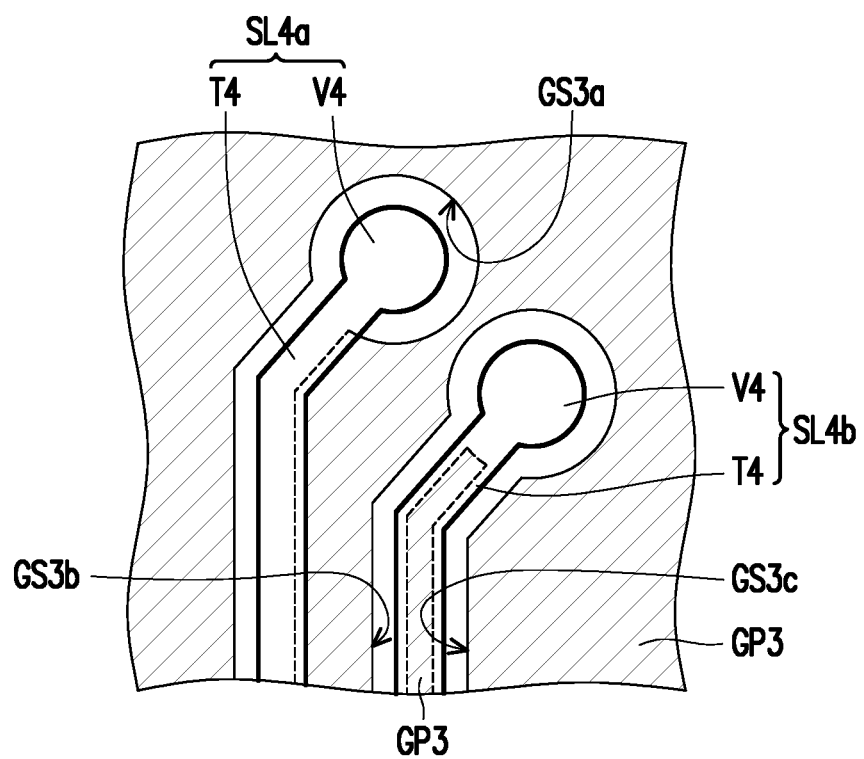

FIG. 3A to FIG. 3C illustrate the signal trace of the signal line partially overlapped with the ground plate of the next redistribution layer in the direction perpendicular to the bottom surface of the signal line according to some other embodiments of the disclosure.

Referring to FIG. 3A and FIG. 3B, in some embodiments, a ground slot GS1b of the ground plate GP1 includes a via slot GV1 and a trace slot GT1 in spatial communication with each other. The dimension (such as width, diameter) of the via slot GV1 is larger than the dimensions of the signal vias V2 of the signal lines SL2. The width W4 of the trace slot GT1 of the ground plate GP1 is less than the width W2 of the corresponding signal traces T2 of the signal lines SL2. In some embodiments in which one ground slot GS1b corresponds to more than one signal lines SL2, the width W4 of the trace slot GT1 is less than the width W2 of the signal traces T2, and the width W2 of the signal traces T2 refers to the distance between opposite outmost sidewalls of the signal traces T2.

Referring to FIG. 3A and FIG. 3C, in some embodiments, one signal line SL4a corresponds to one ground slot GS3a, one signal line SL4b corresponds to two ground slots GS3b and GS3c. The signal trace T4 (such as an edge portion thereof) of the signal line SL4a is partially overlapped with the ground plate GP3 in the direction perpendicular to the bottom surface of the signal trace T4, and the signal trace T4 (such as the middle portion thereof) of the signal line SL4b is partially overlapped with the ground plate GP3 between the ground slots GS3b and GS3c, in the direction perpendicular to a bottom surface of the signal trace T4, respectively.

As illustrated in FIG. 2A to FIG. 2D and FIG. 3A to FIG. 3C, in the embodiments of the disclosure, at least a portion of the ground slot GS1/GS1a/GS1b of the ground plate GP1 is directly below the signal trace T2 and the signal via V2 of the signal line SL2 of the redistribution layer RDL2. That is to say, the signal line SL2 is at least overlapped with a portion of the polymer layer PM2 in the ground slot GS1/GS1a/GS1b in a direction perpendicular to a bottom surface of the signal line SL2. In other words, the signal line SL2 may be partially overlapped with or staggered (such as completely staggered) with the ground plate GP1 in the direction perpendicular to the bottom surface of the signal line SL2. The overlapping area between the signal line SL2 and the ground plate GP1 in the direction perpendicular to the bottom surface of the signal line SL2 is less than the area of the bottom surface of the signal line SL2, and may be zero in some embodiments. Herein, the overlapping area between an element and another element in a direction refers to the area of the portion of the element which is overlapped with the another element in the said direction, or the area of the portion of the another element which is overlapped with the element in the said direction.

In some embodiments, the signal via V2 of the signal line SL2 is staggered (such as completely staggered) with the ground plate GP1, while the signal trace T2 of the signal line SL2 is partially overlapped with (FIGS. 2D, 3A to 3C) or staggered (such as completely staggered) with (FIGS. 2A to 2C) the ground plate GP1, in the direction perpendicular to the bottom surface of the signal line SL2. That is, the overlapping area between the signal via V2 and the ground plate GP1 in the direction perpendicular to the bottom surface of the signal line SL2 is zero, and the overlapping area between the signal trace T2 and the ground plate GP1 in the direction perpendicular to the bottom surface of the signal trace T2 is less than the area of the bottom surface of the signal trace T2, and may be zero in some embodiments. The bottom surface of the signal line SL2 is parallel with bottom surfaces and top surfaces of the polymer layers and redistribution layers of the RDL structure 15.

It is noted that, the configuration examples of the ground slot corresponding to the signal traces shown in FIGS. 2A to 2D and FIGS. 3A to 3C are merely for illustration, and the disclosure is not limited thereto.

In the embodiments of the disclosure, the capacitance between the signal line and the ground plates may be adjusted by setting the ground slots in the ground plates. In the embodiments of the disclosure, the die structure is bonded to an InFO RDL structure, instead of a conventional circuit board substrate. The RDL structure may be formed with a smaller thickness than the conventional circuit board substrate, thereby avoiding or reducing warpage issue of the package structure. Since the polymer layer and the redistribution layer of the RDL structure are relatively thin, the distance between the signal line and the corresponding ground plate is reduced, the configuration of the ground slot may compensate the impact of the reduced distance between the signal line and the corresponding ground plate on the capacitance between the signal line and the corresponding ground plate. Therefore, better signal integrity and electrical performance are achieved.

FIG. 4A to FIG. 4D are cross-sectional views illustrating a method of forming a package structure according to a second embodiment of the disclosure. The second embodiment differs from the first embodiment in that the connectors 16 of the RDL structure 15 are further connected to a circuit board substrate.

Figure 4A:
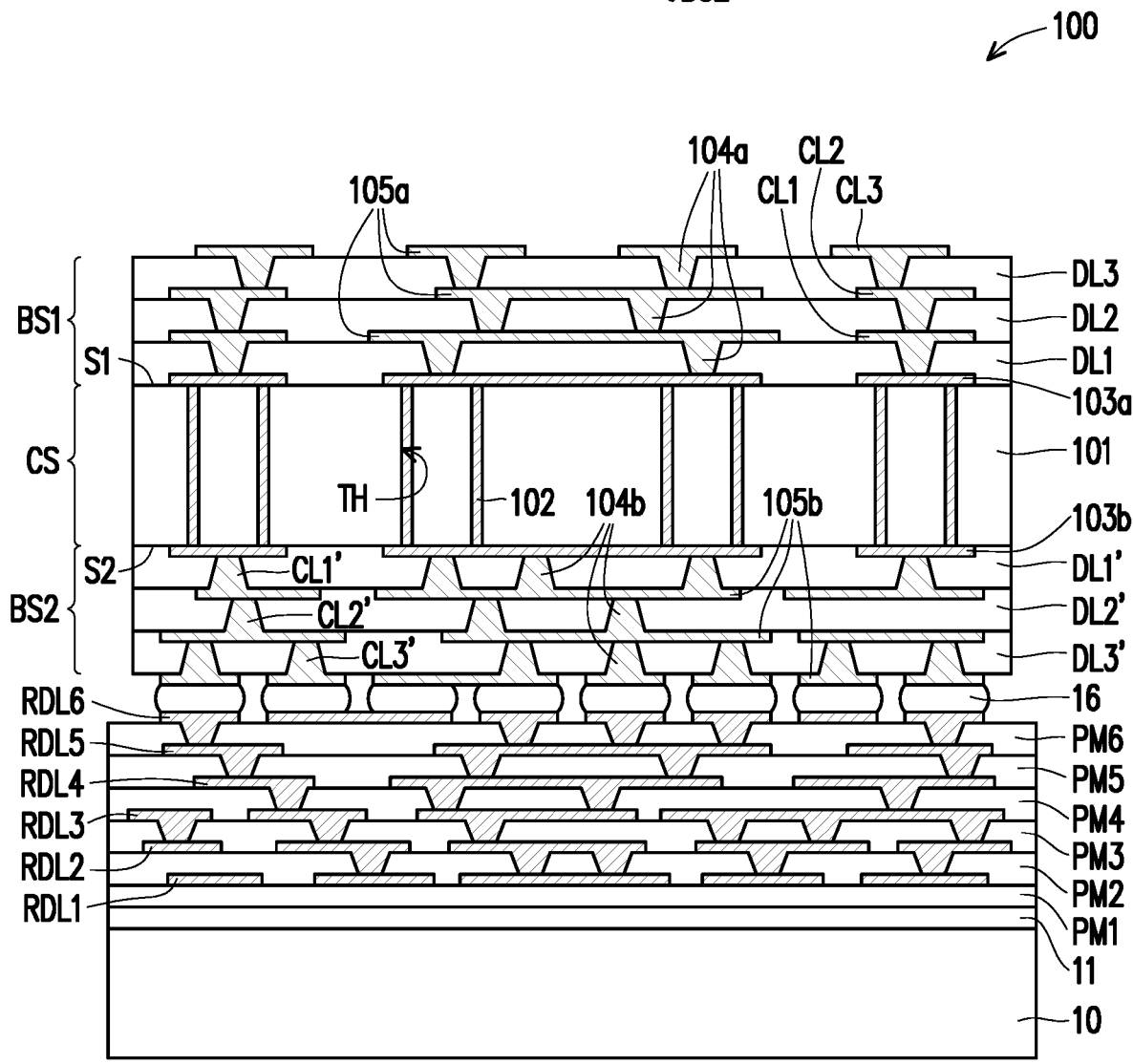
FIG. 4A to FIG. 4D are cross-sectional view illustrating a method of forming a package structure according to a second embodiment of the disclosure.

Referring to FIG. 1E and FIG. 4A, in some embodiments, after the connectors 16 are formed and before the carrier is de-bonded, a circuit board substrate 100 is electrically bonded to the RDL structure 15 through the connectors 16.

Referring to FIG. 4A, in some embodiments, the circuit board substrate 100 includes a core layer structure CS and build-up structures BS1 and BS2 on opposite surfaces of the core layer structure CS. In some embodiments, the core layer structure CS includes a core dielectric layer 101, and conductive layers 102, 103a and 103b. In some embodiments, the core dielectric layer 101 includes prepreg (which contains epoxy, resin, silica filler and/or glass fiber), Ajinomoto Buildup Film (ABF), resin coated copper foil (RCC), polymeric materials (e.g., polyimide, polyester, benzocyclobutene (BCB), polybenzoxazole, or the like), photo image dielectric (PID), ceramic core, glass core, molding compound, phenolic paper, phenolic cotton paper, woven fiberglass cloth, impregnated woven fiberglass cloth, or combinations thereof, or the like. However, the disclosure is not limited thereto, and other dielectric materials may also be used. The core dielectric layer 101 may be formed by a lamination process, a coating process, or the like.

In some embodiments, the core dielectric layer 101 includes a plurality of through holes TH penetrating through the core dielectric layer 101. The conductive layer 102 lines the through hole TH and may extends to cover the opposite top and bottom surfaces of the core dielectric layer 101. The conductive layers 103a and 103b are disposed on opposite surfaces (i.e. top and bottom surfaces) of the core dielectric layer 101 to cover the through hole TH and connect to the conductive layer 102, respectively. In some embodiments, the conductive layers 102, 103a and 103b include copper, gold, tungsten, aluminum, silver, gold, a combination thereof, or the like. The conductive layers 103a and 103b may also be referred to as conductive caps.

In some embodiments, the portion of the through hole TH enclosed by the conductive layers 102, 103a and 103b form an air gap, but the disclosure is not limited thereto. In alternative embodiments, the through hole TH is filled up with conductive layer 102. In yet another embodiments, filling material (not shown) may be filled in the through hole TH and surrounded by the conductive layers 102, 103a and 103b. The filling material may include an insulating material, a conductive material or a combination thereof.

The build-up structure BS1 includes a plurality of dielectric layers DL1, DL2, DL3 and a plurality of conductive layers CL1, CL2, CL3 alternatively stacked on the first surface S1 (such as, top surface) of the core layer structure CS. The build-up structure BS2 includes a plurality of dielectric layers DL1', DL2', DL3' and a plurality of conductive layers CL1', CL2', CL3' alternatively stacked on the second surface S2 (such as bottom surface) of the core layer structure CS. The thicknesses of the dielectric layers DL1, DL2, DL3 may be the same as or different from each other. The thicknesses of the conductive layer CL1, CL2, CL3 may be the same as or different form each other. The number of the dielectric layers and conductive layers of the build-up structures BS1 and BS2 shown in the figures are merely for illustration, and the disclosure is not limited thereto. The number of the dielectric layers and conductive layers of the build-up structures BS1 may be the same as or different from the dielectric layers and conductive layers of the build-up structures BS2.

In some embodiments, the thicknesses of the dielectric layers and conductive layers of the circuit board substrate 100 are larger than the thicknesses of the polymer layers and redistribution layers of the RDL structure 15, respectively. For example, the ratio of the thickness of one of the polymer layers PM1-PM6 of the RDL structure 15 to the thickness of one of the dielectric layers DL1-DL3 to DL1'-DL3' of the circuit board substrate 100 is, for example, 1/3. The ratio of the thickness of one of the redistribution layers RDL1-RDL6 of the RDL structure 15 to the thickness of one of the conductive layers CL1-CL3 to CL1'-CL3' of the circuit board substrate 100 is, for example, 1/2.

In some embodiments, the material of the dielectric layers DL1, DL2, DL3, DL1', DL2', DL3' may include ABF, prepreg, RCC, polyimide, PID, molding compound, polyimide, epoxy resin, acrylic resin, phenol resin, benzocyclobutene (BCB), polybenzooxazole (PBO), or combinations thereof, or the like, respectively. The material of the dielectric layers of the build-up structures BS1 and BS2 may be the same as or different from the material of the core dielectric layer 101. In some embodiments, the material of the conductive layers CL1, CL2, CL3, CL1', CL2', CL3' may include aluminum, titanium, copper, nickel, tungsten, alloys thereof or combination thereof, respectively. The materials of the different dielectric layers may be the same or different, and the materials of the different conductive layers may be the same or different.

Still referring to FIG. 4A, the conductive layers CL1, CL2, CL3 of the build-up structure BS1 are electrically connected to the conductive layers CL1', CL2', CL3' of the build-up structure BS2 through the conductive layers 102, 103a, 103b of the core layer structure CS. The conductive layers CL1, CL2, CL3 include a plurality of vias 104a and traces 105a connected to each other, respectively. The conductive layers CL1', CL2', CL3' include a plurality of vias 104b and traces 105b connected to each other, respectively. The vias 104a, 104b penetrate through the corresponding dielectric layer to connect the traces of different conductive layers, or connect the traces to the conductive layer of the core layer structure CS. The traces 105a, 105b are extending on the corresponding dielectric layer. In some embodiments, the vias 104a and 104b are tapered toward the core layer structure CS, but the disclosure is not limited thereto.

In some embodiments, the outmost conductive layer CL3' of the build-up structure BS2 are electrically connected to the connectors 16, such that the circuit board substrate 100 is electrically connected to the RDL structure 15. The traces 105b of the conductive layer CL3' may protrude from the bottom surface of the dielectric layer DL3'. In some embodiments, the outmost conductive layer CL3 of the build-up structure BS1 may protrude from the top surface of the dielectric layer DL3. However, the disclosure is not limited thereto.

Figure 4B:
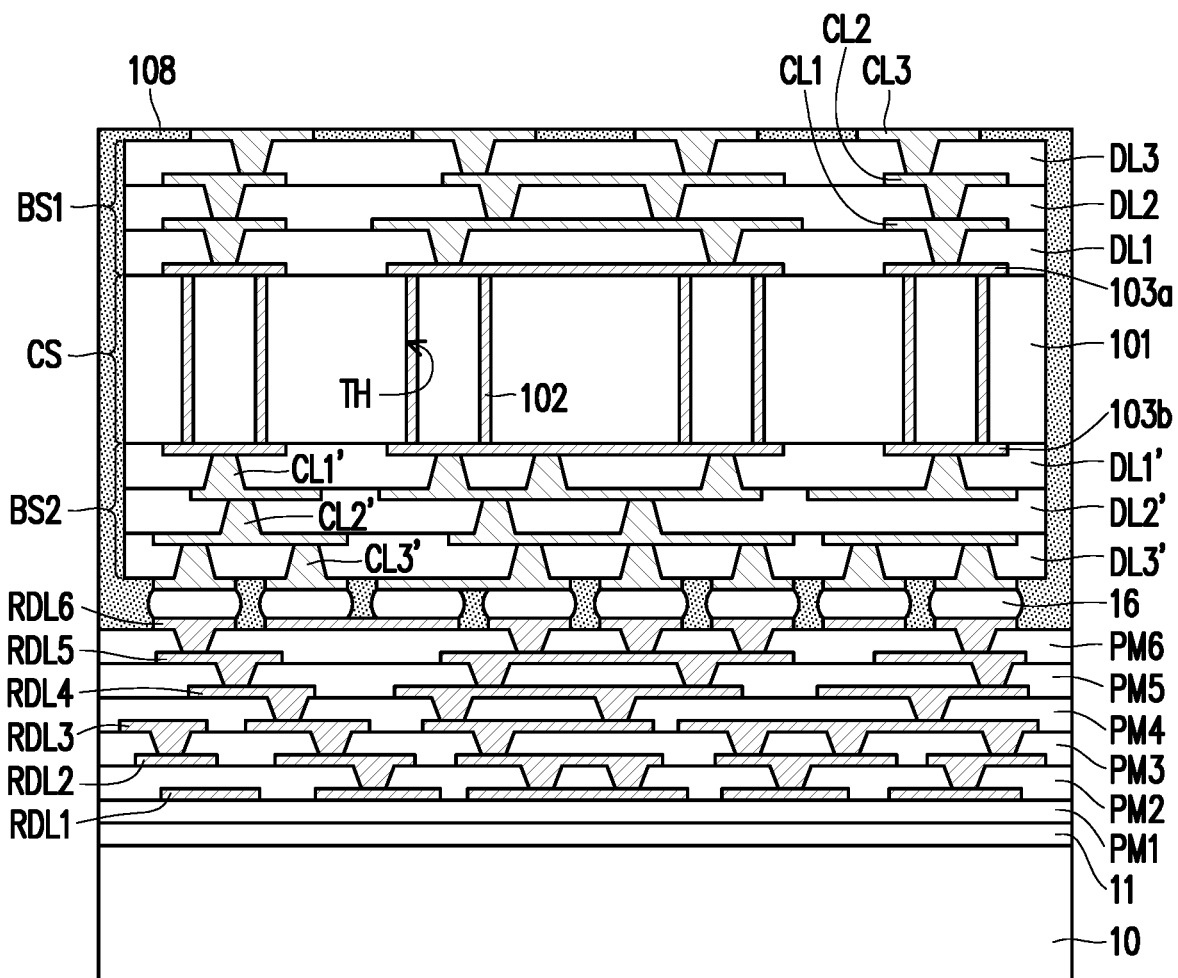

Referring to FIG. 4B, in some embodiments, an encapsulant layer 108 is formed over the carrier 10. For example, the encapsulant layer 108 is formed on the RDL structure 15, filling the space between the circuit board substrate 100 and laterally surrounding the connectors 16, the conductive layer CL3' and the redistribution layer RDL6, and laterally surrounding sidewalls of the circuit board substrate 100. In some embodiments, the material of the encapsulant layer 108 may include a molding compound, a molding underfill, a resin such as epoxy, combinations thereof, or the like. The forming method of the encapsulant layer 108 may include a molding process, a molding underfilling (MUF) process, or a combination thereof. In some embodiments, the encapsulant layer 108 may be formed by the following process. For example, an encapsulant material layer is formed over the carrier 10, the top surface of the encapsulant material layer may be higher than and cover the top surface of the circuit board substrate 100. Thereafter, a planarization process is then formed to remove a portion of the encapsulant material layer over the top surface of the circuit board substrate 100, such that the conductive layer CL3 is exposed.

In some embodiments, the top surface of the encapsulant layer 108 is substantially coplanar with the top surface of the conductive layer CL3, and portions of the encapsulant layer 108 are laterally aside and between the conductive layers CL3. However, the disclosure is not limited thereto.

Figure 4C:
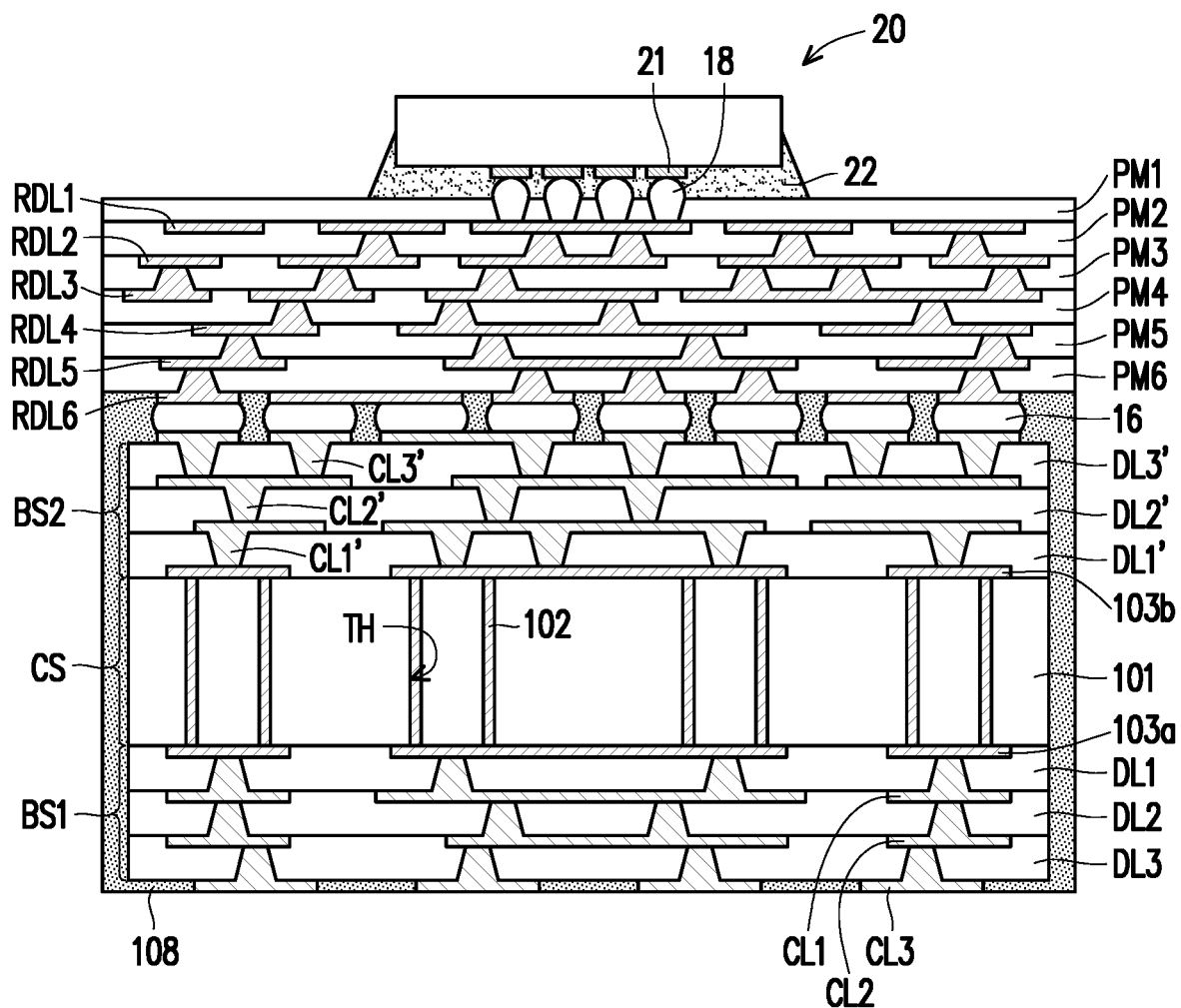

Referring to FIG. 4B and FIG. 4C, thereafter, processes similar to those described in FIG. 1F and FIG. 1G are performed. For example, the carrier 10 is released with the de-bonding layer 11 decomposed under the heat of light. The resulted structure is turned over, such that the polymer layer PM1 is upward. Afterwards, the polymer layer PM1 is patterned to form a plurality of openings exposing portions of the redistribution layer RDL1. Connectors 18 are formed on the redistribution layer RDL1 exposed by the openings of the polymer layer PM1. Thereafter, a die structure 20 may be bonded to the RDL structure 15 through the connectors 18, an underfill layer 22 may be formed to fill the space between the die structure 20 and the RDL structure 15, and laterally surround the connectors 18 and the connectors 21.

Figure 4D:
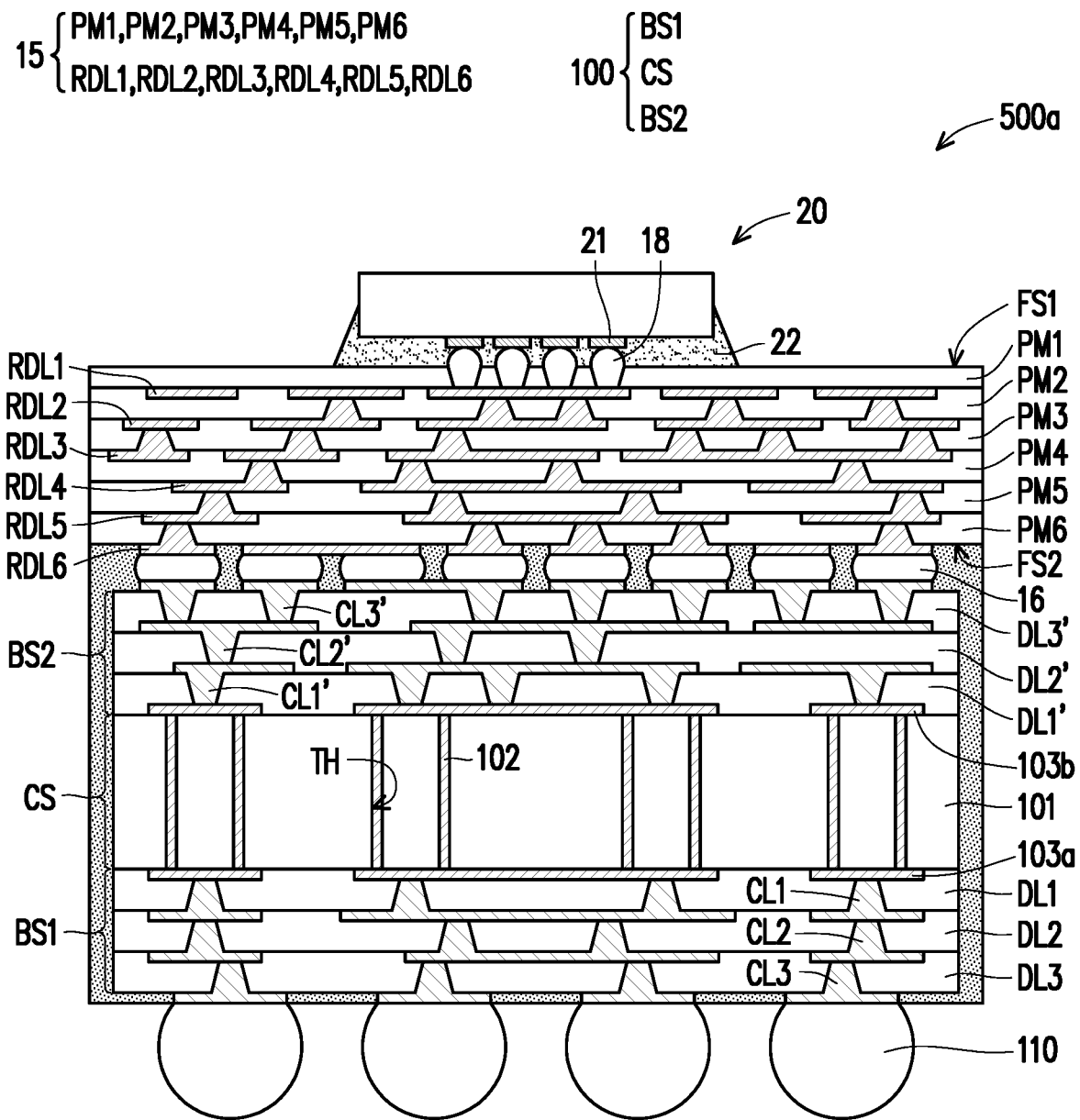

Referring to FIG. 4D, a plurality of connectors 110 are formed on the exposed conductive layer CL3 of the circuit board substrate 100, and a package structure 500a is thus formed. The connectors 110 may also be referred to as the conductive terminals of the package structure 500a. The material and forming method of the connectors 110 are similar to, and may be the same as or different from those of the connectors 16.

In the second embodiment, a circuit board substrate is further connected to the RDL structure on the opposite side of the die structure. The package structure in the second embodiment may be applied for high performed computing (HPC) system. Since the die structure is firstly bonded to the RDL structure, the layers of the circuit board substrate may be reduced, and the overall thickness of the resulted package structure is reduced. As such, the warpage issue is avoided or reduced. The other improved property of the package structure in the second embodiment resulted from the RDL structure are substantially the same as those described in the first embodiment, which are not described again here.

Figure 5:
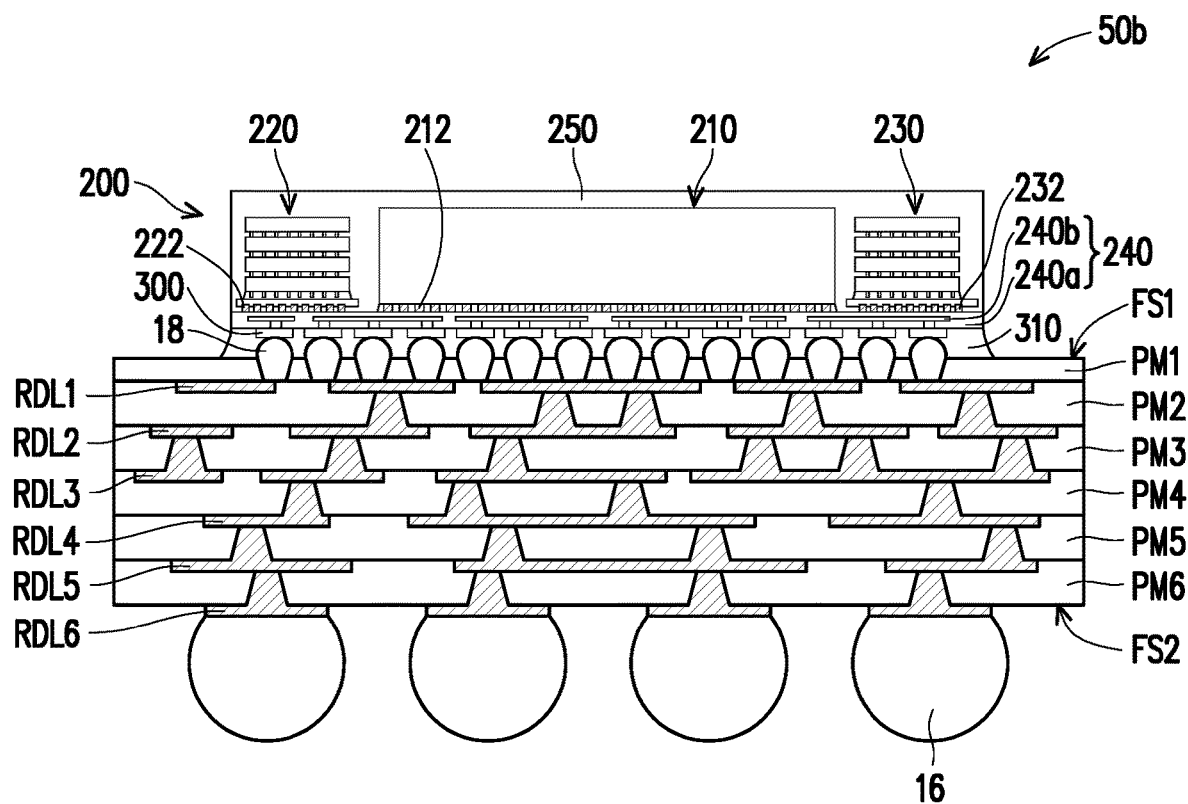
FIG. 5 and FIG. 6 are cross-sectional views respectively illustrating an example of a package structure according to some embodiments of the disclosure.
Figure 6:
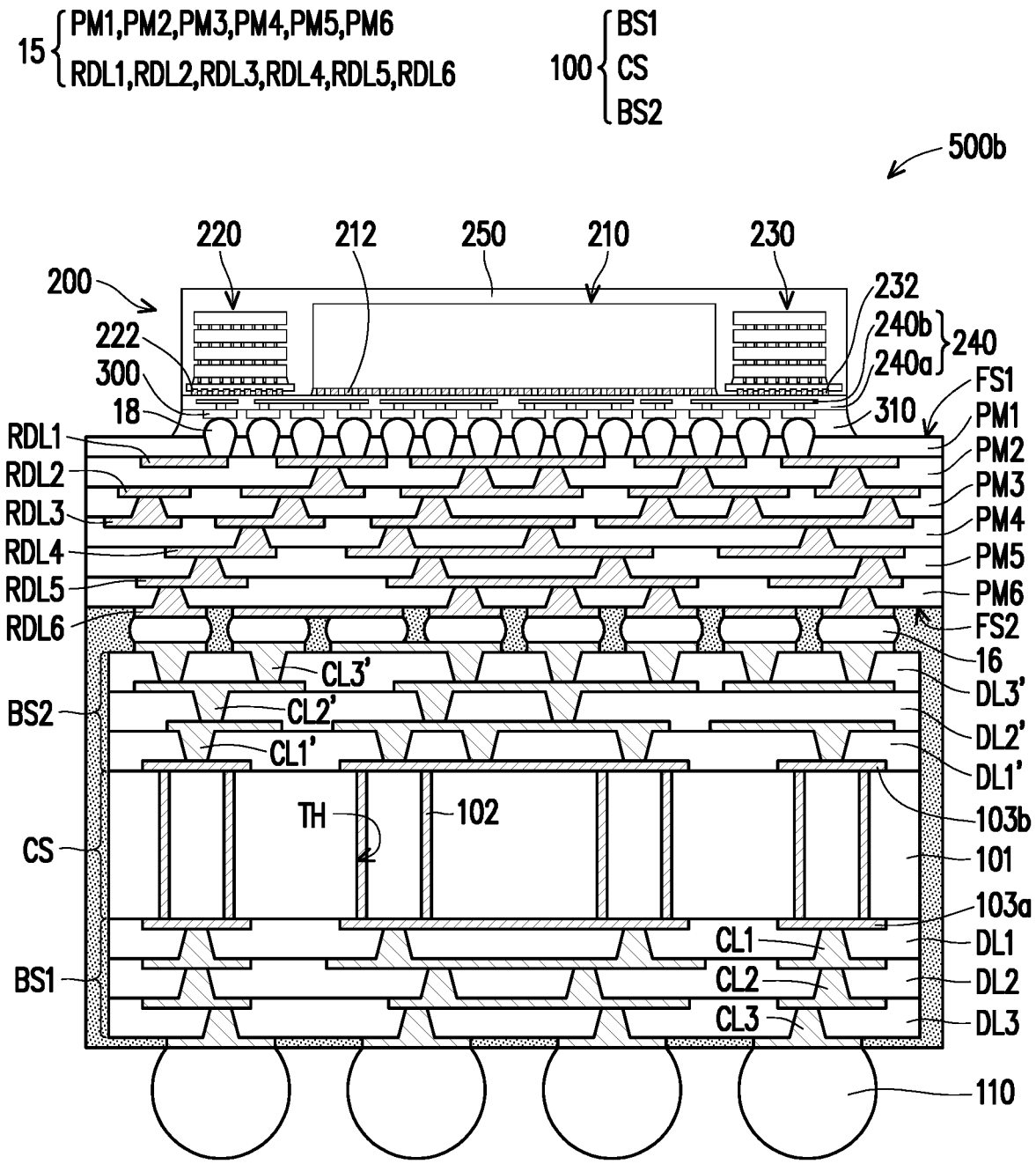

FIG. 5 and FIG. 6 illustrate some examples of the die structure 20 included in the package structure according to some embodiments of the disclosure.

Referring to FIG. 1G and FIG. 5, a package structure 50b corresponds to the package structure 50a is illustrated. In some embodiments, the die structure 20 includes at least one semiconductor package 200. For example, the semiconductor package 200 may be connected to the connectors 18 of the RDL structure 15. The disclosure is not limited neither by the type nor the number of semiconductor packages 200 connected to the RDL structure 15.

In some embodiments, the semiconductor package 200 includes semiconductor dies 210, 220, 230, bonded to an interposer 240 and encapsulated by an encapsulant 250. In some embodiments, the semiconductor dies 210, 220, 230 include semiconductor substrates having active components (e.g., transistors or the like) and optionally passive components (e.g., resistors, capacitors, inductors, or the like) formed therein. The semiconductor dies 210, 220, 230 may be connected to the interposer 240 via connectors 212, 222, 232. In some embodiments, the connectors 212, 222, 232 include copper, copper alloys, or other conductive materials, and may be formed by deposition, plating, or other suitable techniques. Each of the semiconductor dies 210, 220, 230 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or more of the semiconductor dies 210, 220, 230 include a memory die such as a high bandwidth memory die. In some embodiments, the semiconductor dies 210, 220, 230 may be the same type of dies or perform the same functions. In some embodiments, the semiconductor dies 210, 220, 230 may be different types of dies or perform different functions. In some embodiments, the semiconductor die 210 includes a logic die, and the semiconductor dies 220 and 230 include memory dies. In some embodiments, the semiconductor dies 220 and 230 include memory stacks, in which multiple electrically connected chips are stacked on top of each other. Generally speaking, the semiconductor package 200 may include a wide variety of devices, such as processors, resistors, capacitors, transistors, diodes, fuse devices, memories, discrete electronic devices, power coupling devices or power systems, thermal dissipation devices, combinations thereof, or the like formed therein.

The interposer 240 may include dielectric layer 240a and conductive layers (or redistribution layers) 240b located in the dielectric layer 240a. The conductive layers 240b are electrically connected to the connectors 212, 222, 232 of the semiconductor dies 210, 220, 230 and the RDL structure 15. In some embodiments, the interposer 240 is a fan-out RDL structure 240 connecting the semiconductor dies 210, 220, 230 to the RDL structure 15. In some embodiments, the RDL structure 240 is referred to as a first fan-out RDL structure, and the RDL structure 15 is referred to as a second fan-out RDL structure.

In some embodiments, the connectors 300 are formed on the interposer 240. In some embodiments, the connectors 300 include metals such as copper, nickel, or solder regions, or the like. In some embodiments, the connectors 300 are formed on the semiconductor package 200. The connectors 300 on the semiconductor package 200 are electrically connected to the connectors 18 to provide electrical connection between the semiconductor package 200 and the RDL structure 15.

In some embodiments, an underfill layer 310 is formed to fill the space between the interposer 240 and the RDL structure 15, and laterally surround the connectors 300 and the connector 18.

In the embodiments of the disclosure, die structure is bonded to a fan-out RDL structure which has a smaller thickness than a circuit board substrate, and the thickness of the resulted package structure is reduced, thereby avoiding warpage issue. On the other hand, the configuration of the ground slot in the ground plate may compensate the impact of the reduced thickness on the capacitance between the signal line and the corresponding ground plate.

FIG. 6 illustrates a package structure 500b corresponds to the package structure 500a of the second embodiments. In some embodiments, the die structure 20 of the package structure 500a (FIG. 4D) may include at least one semiconductor packages 200. The structure of the semiconductor package 200 is similar to those descried in FIG. 5, which are not described again here.

In accordance with some embodiments of the disclosure, a package structure incudes a die and a redistribution layer (RDL) structure electrically connected to the die. The RDL structure includes a first redistribution layer, a second redistribution layer and a third redistribution layer. The first redistribution layer includes a first ground plate. The second redistribution layer includes a second ground plate and a signal trace. The signal trace is laterally spaced from the second ground plate. The third redistribution layer includes a third ground plate. The third redistribution layer and the first redistribution layer are disposed on opposite sides of the second redistribution layer. The signal trace is staggered with at least one of the first ground plate and the third ground plate in a direction perpendicular to a top surface of the signal trace.

In accordance with some embodiments of the disclosure, a RDL structure includes a first redistribution layer, a second redistribution layer, a third redistribution layer and an additional redistribution layer. The first redistribution layer includes a first ground plate. The second redistribution layer is disposed over the first redistribution layer and includes a second ground plate and a signal trace disposed in between and laterally spaced from the second ground plate. The third redistribution layer is disposed over the second redistribution layer and includes a third ground plate. The additional redistribution layer is disposed below the first redistribution layer and includes an additional ground plate. A capacitance between the signal trace and the additional ground plate is less than a capacitance between the signal trace and the third ground plate.

In accordance with some embodiments of the disclosure, a RDL structure includes a first ground plate, a second ground plate and a signal trace. The first ground plate is disposed on a first side of the second ground plate. The signal trace is disposed in between the second ground plate. The first ground plate includes a slot at a position overlapped with the signal trace in a direction perpendicular to a top surface of the signal trace, and there is free of conductive feature in the slot.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:
1. A package structure, comprising:
a die; and
a redistribution layer (RDL) structure, electrically connected to the die, the RDL structure comprises:

a first redistribution layer, comprising a first ground plate;

a second redistribution layer, comprising a second ground plate and a signal trace, wherein the signal trace is laterally spaced from the second ground plate; and a third redistribution layer, comprising a third ground plate, wherein the third redistribution layer and the first redistribution layer are disposed on opposite sides of the second redistribution layer, wherein the signal trace is staggered with at least one of the first ground plate and the third ground plate in a direction perpendicular to a top surface of the signal trace, wherein the first ground plate comprises a first trace slot at a position overlapped with the signal trace in the direction perpendicular to the top surface of the signal trace, and there is free of conductive feature within the first trace slot, wherein the third ground plate comprises a second trace slot at a position overlapped with the signal trace in the direction perpendicular to the top surface of the signal trace, and there is free of conductive feature within the second trace slot.

2. The package structure of claim 1, wherein the signal trace is disposed within an opening of the second ground plate, the opening is defined by opposite inner sidewalls of the second ground plate and filled by the signal trace and a polymer layer.

3. The package structure of claim 1, wherein a width of the first trace slot is larger than or less than a width of the signal trace.

4. The package structure of claim 1, wherein the first trace slot comprises a continuous trench extending in a direction substantially the same as an extending direction of the signal trace.

5. The package structure claim 1, wherein the first trace slot comprises discrete openings arranged in a direction substantially the same as an extending direction of the signal trace.

6. The package structure of claim 1, wherein an overlapping area between the signal trace and the first ground plate is different from an overlapping area between the signal trace and the third ground plate.

7. The package structure of claim 1, further comprising:
a connector, disposed between the die and RDL structure to provide electrical connection between the die and the RDL structure; and
an underfill layer, disposed between the die and the RDL structure and laterally surrounding the connector.

8. A redistribution layer (RDL) structure, comprising:
a first redistribution layer comprising a first ground plate;
a second redistribution layer disposed over the first redistribution layer and comprising a second ground plate and a signal trace disposed in between and laterally spaced from the second ground plate;
a third redistribution layer, disposed over the second redistribution layer and comprising a third ground plate; and
an additional redistribution layer disposed below the first redistribution layer and comprising an additional ground plate;
wherein the first ground plate comprises a trace slot at a position overlapped with the signal trace in the direction perpendicular to the top surface of the signal trace, there is free of conductive feature within the trace slot, wherein a width of the signal trace is less than a width of the trace slot.

9. The RDL structure of claim 8, further comprising:
a first polymer layer, disposed on the additional redistribution layer;
a second polymer layer disposed on the first polymer layer and covering the first redistribution layer; and
a third polymer layer, disposed on the second polymer layer and covering the second redistribution layer,
wherein a portion of the second polymer layer directly below the signal trace is in contact with the first polymer layer.

10. The RDL structure of claim 9, wherein an orthographic projection of the signal trace on a top surface of the first second polymer layer is spaced apart from or partially overlapped with an orthographic projection of the first ground plate on the top surface of the second polymer layer.

11. The RDL structure of claim 8, wherein the trace slot is filled by a polymer material.

12. The RDL structure of claim 11, wherein the trace slot is defined by a first inner sidewall and a second inner sidewall of the first ground plate that are opposite to each other, and the polymer material continuously extends from the first inner sidewall to the second inner sidewall of the first ground plate.

13. The RDL structure of claim 8, wherein a thickness of a continuous polymer material between the signal trace and the additional ground plate is larger than a thickness of a continuous polymer material between the signal trace and the third ground plate.

14. The package structure of claim 8, further comprising a signal via at an end of the signal trace, wherein a width of the signal via is larger than a width of the signal trace.

15. The package structure of claim 14, wherein a width of a first portion of the trace slot is larger than a width of a second portion of trace slot, and the first portion the trace slot is corresponding to the signal via, and second portion of the trace slot is corresponding to the signal trace.

16. A redistribution layer (RDL) structure, comprising:
a first ground plate;
a second ground plate, wherein the first ground plate is disposed on a first side of the second ground plate;
a signal trace, disposed in between the second ground plate; and
a polymer material, disposed on the signal trace and the second ground plate, and between the signal trace and the second ground plate,
wherein the first ground plate comprises a slot at a position overlapped with the signal trace in a direction perpendicular to a top surface of the signal trace, and there is free of conductive feature in the slot,
wherein a thickness of the signal trace is less than a thickness of the polymer layer.

17. The RDL structure of claim 16, wherein the slot is defined by inner sidewalls of the first ground plate, and the inner sidewalls of the first ground plate is aligned with or laterally shifted from sidewalls of the signal trace.

18. The RDL structure of claim 16, further comprising a polymer layer disposed to cover the first ground plate, wherein an overlapping area between the signal trace and the first ground plate is less than an orthographic projection area of the signal trace on a bottom surface of the polymer layer.

19. The RDL structure of claim 16, further comprising:
a third ground plate, disposed on a second side of the second ground plate opposite to the first side.

20. The RDL structure of claim 19, wherein an overlapping area between the signal trace and the first ground plate is less than an overlapping area between the signal trace and the third ground plate.

* * * * *